US006825125B2

United States Patent
Hiromasu et al.

(10) Patent No.: US 6,825,125 B2
(45) Date of Patent: Nov. 30, 2004

(54) THIN-FILM-TRANSISTOR-ARRAY SUBSTRATE, THIN-FILM-TRANSISTOR-ARRAY FABRICATION METHOD, AND DISPLAY DEVICE

(75) Inventors: Yasunobu Hiromasu, Fujisawa (JP); Teruhiro Nakasogi, Shiga-ken (JP)

(73) Assignee: International Business Machines Corporation, Armonk, NY (US)

( * ) Notice: Subject to any disclaimer, the term of this patent is extended or adjusted under 35 U.S.C. 154(b) by 266 days.

(21) Appl. No.: 10/144,162

(22) Filed: May 10, 2002

(65) Prior Publication Data

US 2002/0173155 A1 Nov. 21, 2002

(30) Foreign Application Priority Data

May 18, 2001 (JP) .......................................... 2001-148769

(51) Int. Cl.[7] .............................................. H01L 21/302
(52) U.S. Cl. ........................ 438/706; 438/710; 438/720; 257/59; 257/72
(58) Field of Search ................................. 438/706, 710, 438/712, 720; 257/59, 72, 347, 350, 352, 622

(56) References Cited

U.S. PATENT DOCUMENTS

| 6,262,438 B1 | * | 7/2001 | Yamazaki et al. | ............. | 257/72 |
| 6,395,586 B1 | * | 5/2002 | Huang et al. | ............... | 438/149 |
| 6,624,871 B1 | * | 9/2003 | Kim | ........................... | 349/192 |

FOREIGN PATENT DOCUMENTS

| JP | 10-020339 | 2/1998 |
| JP | 10-170951 | 6/1998 |

\* cited by examiner

Primary Examiner—Lan Vinh
(74) Attorney, Agent, or Firm—Ira D. Blecker

(57) ABSTRACT

A TFT array substrate 10 of the present invention includes an insulating substrate 12, thin-film transistors formed on the insulating substrate 12 in a matrix, and wirings 46 electrically connected to the thin-film-transistors. A gate-insulating film 32 is formed on the wiring 46, a passivation film 38 is formed on the gate-insulating film 32, and moreover an interlayer insulating film 42 containing an organic polymer with an edge formed thereon is formed on the gate-insulating film 32. An etching stopper 50 is formed on at least either of the gate-insulating film 32 exposed from the edge 48 of the interlayer insulating film 42 or the passivation film 38.

15 Claims, 15 Drawing Sheets

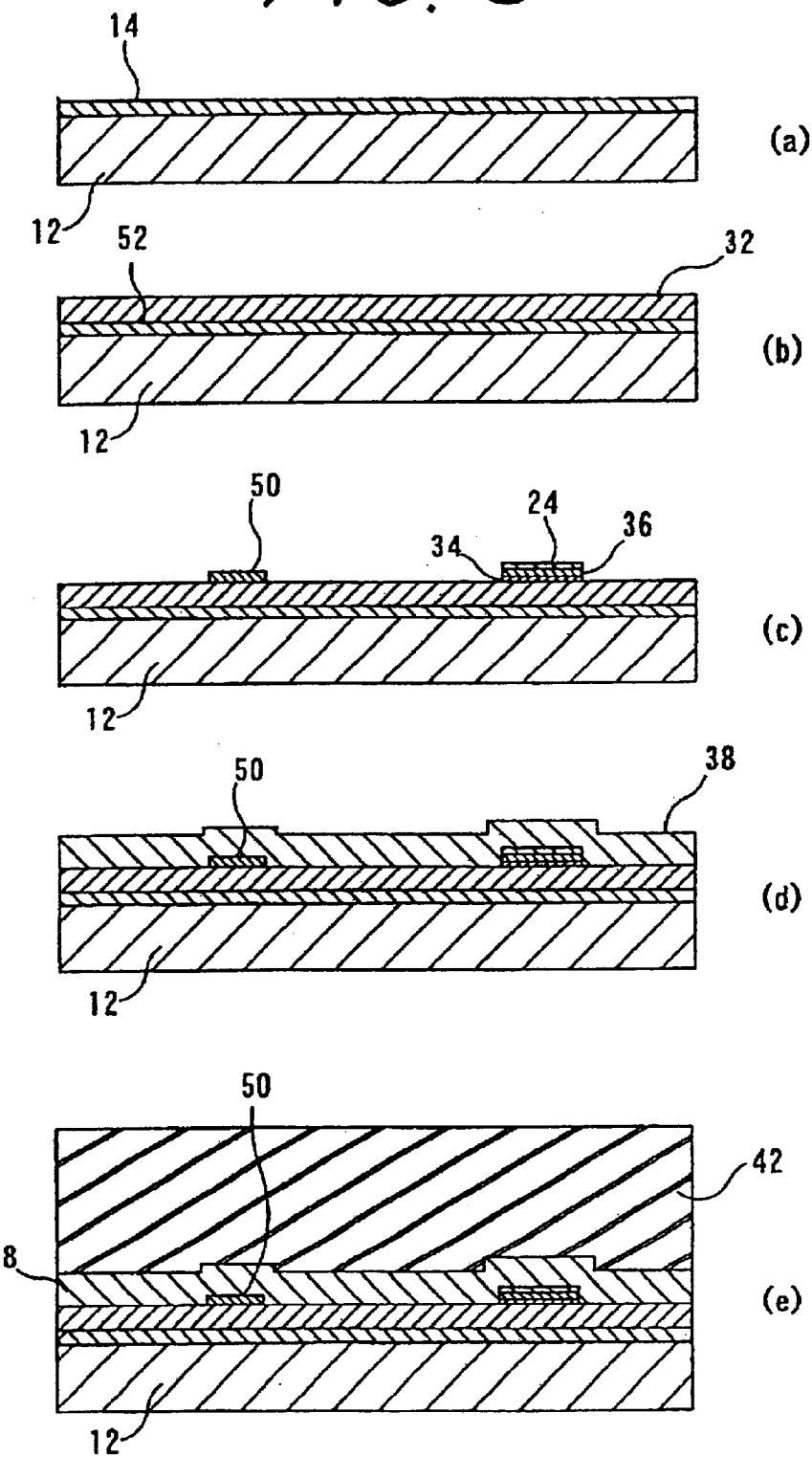

(h)

(i)

(a)

(b)

(c)

THIN-FILM-TRANSISTOR-ARRAY SUBSTRATE, THIN-FILM-TRANSISTOR-ARRAY FABRICATION METHOD, AND DISPLAY DEVICE

FIELD OF THE INVENTION

The present invention relates to a thin-film-transistor-array substrate, specifically to a more reliable thin-film-transistor-array substrate by preventing a short circuit between wirings or interconnects from pads to array lines extended from a thin-film-transistor, a high productivity fabrication method of the thin-film-transistor-array substrate, and a display device using the thin-film-transistor-array substrate.

BACKGROUND OF THE INVENTION

A display device such as a liquid-crystal display device or an electroluminescence display device using an inorganic or organic active material is recently widely used in view of reduction in size and weight. To drive the display device of these types, a thin-film-transistor-array substrate (hereafter referred to as TFT array substrate) is mostly used which is formed by arranging a plurality of thin-film transistors (TFTs) on an insulating substrate made of glass.

Particularly, to meet the requirement for high resolution while achieving reduction in size and weight, it is recently studied to use a structure in which an interlayer insulating film made of a polymer insulating film containing an insulating organic polymer is formed on the entire surface of a substrate including TFTs (hereafter referred to as a PFA structure), for the above TFT array substrate. The PFA structure is particularly marked in liquid-crystal displays for which characteristics such as reduction in size and improvement in brightness are required because it is possible to increase the effective area of the pixel electrode. In the case of the TFT array substrate including the PFA structure, a contact hole is formed in an interlayer insulating film to connect a lower wiring with a pixel electrode formed on the interlayer insulating film.

In the case of conventional formation of a contact hole in a TFT array substrate including the above PFA structure, independent photolithography processes are carried out to form a contact hole formed in the interlayer insulating film and to form a through-hole reached to the underlying TFT structure through the interlayer insulating film. Therefore, a TFT array substrate including the PFA structure has an advantage that the effective area of a pixel electrode is increased while it has a disadvantage that the fabrication cost is increased.

To overcome the above disadvantage, it is studied to form an interlayer insulating film by a photosensitive resin or a photosensitive polymer composition and reduce the photolithography processes using photomasks to one step. FIGS. 12(a) to 12(c) show a part of a conventional fabrication process for a thin-film-transistor-array substrate including a PFA structure.

As shown in FIG. 12(a), in a conventional TFT array substrate fabrication process using a photosensitive resin or a photosensitive polymer composition, an interlayer insulating film 88 is formed by applying an insulating organic polymer such as a photosensitive resin or a photosensitive polymer composition on the TFT structure including a gate wiring 82, a gate-insulating film 84, and a passivation film 86 on an insulating substrate 80. The interlayer insulating film 88 is patterned by photolithography. The edge of the interlayer insulating film 88 and a contact hole are formed in the interlayer insulating film 88 in accordance with the above patterning process. The conventional example shown in FIG. 12(a) shows a part of the substrate including the edge of the interlayer insulating film 88 as a cross section.

Then as shown in FIG. 12(b), in the conventional fabrication method, a transparent conductive film 90 for forming a pixel electrode is deposited on the structure including the interlayer insulating film 88 by chemical vapor deposition (CVD), sputtering, or vacuum evaporation. Then, to form a structure such as a pixel electrode by patterning the deposited transparent conductive film 90, a photoresist 92 is applied onto a TFT array substrate and exposed to the radiation and developed, then the transparent conductive film 90 is etched through a proper dry etching process or wet etching process. After the transparent conductive film 90 is etched, various conductive structures including the pixel electrode 94 shown in FIG. 12(c) are formed.

In the case of the PFA structure, it is necessary to increase the thickness of the interlayer insulating film 88 in order to decrease the parasitic capacity between the lower wiring layer of the interlayer insulating film 88 and the pixel electrode 94 and to completely flatten the step due to a pattern formed on the lower layer. Therefore, to fabricate the PFA structure at only one step of photolithography process, the photoresist used to etch the transparent conductive film 90 is applied so as to be thin on the interlayer insulating film 88 and so as to be thick at the portion where the edge of the interlayer insulating film 88 is formed.

If the photoresist in such condition is exposed to a radiation, the transmissive radiation dosage is low at the lower portion of the edge of the interlayer insulating film where the film thickness of the photoresist is large and then, a sufficient development contrast is not obtained. Therefore, the photoresist 92 remains around the lower portion of the edge of the interlayer insulating film 88. A part of the transparent conductive film under the remaining photoresist is not removed by the etching. Therefore, the transparent conductive film forms a conductive structure extending along the edge of the interlayer insulating film and it causes a short circuit.

FIG. 13 is a schematic perspective view showing the transparent conductive film 90 remaining due to the above imperfect etching at the lower portion of the edge of the interlayer insulating film 88. As shown in FIG. 13, if the photoresist having large difference of the thickness as mentioned above is developed under the identical condition, the photoresist is not completely removed and then a part of the transparent conductive film 90 remains at the lower portion of the edge. As a result, wiring patterns 82 formed from a gate wiring and the like to be connected to a TFT are short-circuited. This short circuit also occurs on a wiring pattern 96 formed from a source wiring or a signal wiring. It may cause the product yield to decrease and the cost to rise.

For the purpose of explanation, FIG. 13 shows schematically the wiring patterns 82 and 96 connected to a gate wiring and a signal wiring, respectively, being adjacently. Moreover, the edge of the interlayer insulating film may occur not only at the edge of a substrate on which a wiring or an interconnect pattern is formed but also when forming a contact hole in an area in which a thin-film transistor is formed.

To overcome the above disadvantages, various studies have been performed so far. For example, in the case of the official gazette of Published Unexamined Patent Application No. 10-20339, an insulating film for preventing a short-circuit is formed between an interlayer insulating film and a conductive film for preventing a disconnecting, and it is exposed from the edge of the interlayer insulating film. In the case of the method disclosed in this application, the edge of the insulating film for preventing the short-circuit is dropped into aligning with the edge of the interlayer insulating film in the process for etching the underlying layer by only one step of photolithography with using the interlayer insulating film as a resist. Therefore, the method disclosed in this application has a disadvantage that it is impossible to form a insulating film for preventing the short-circuit while exposing the film from the interlayer insulating film. Therefore, it is impossible to properly use the method disclosed in this application for a process in which a contact hole is formed by only one step of photolithography to improve the self-alignment of the contact hole.

Moreover, the official gazette of Published Unexamined Patent Application No. 10-170951 discloses a method of forming a conductive wiring as a two-layer structure of an anode oxide film and a film deposited by CVD and using an anode oxide film formed on surface as an insulating film for preventing a short-circuit. However, the method disclosed in this application has disadvantages that not only the photolithography process but also the anode oxidation process are necessary and processes are extremely complicated. Moreover, though a method of removing the remaining photoresist and a transparent conductive film with using laser abrasion or the like are proposed, the method requires a high cost and the productivity by the method cannot be satisfied.

As described above, a thin-film-transistor (TFT) array substrate in which an interlayer insulating film can be formed by only one photolithography step and which can be fabricated with high productivity and yield without causing a short circuit between wirings, a fabrication method of the TFT array substrate, and a display device using the TFT array substrate have been required so far.

Moreover, a thin-film-transistor array substrate making it possible to pattern an interlayer insulating film and at the same time, prevent wirings from being short-circuited without causing a short-circuit between conductive wirings exposed from the interlayer insulating film such as interconnects through simple process steps, a fabrication method of the TFT array substrate, and a display device including the TFT array substrate have been required.

BRIEF SUMMARY OF THE INVENTION

The present invention is made to solve the above problems. The present invention forms an etching stopper at the edge of an interlayer insulating film corresponding to the portion of a conductive wiring exposed from the interlayer insulating film such as an interconnect. When the etching stopper is once formed, it is possible to form the edge of an interlayer insulating film and simultaneously securely insulate the conductive wiring by the insulating structure formed of the insulating film at the lower portion of the etching stopper by only one step of photolithography for forming the edge of the interlayer insulating film. Therefore, it is possible to perform various processes and steps to be subsequently applied without considering a short circuit between conductive wirings exposed from the interlayer insulating film in succeeding processes and steps for depositing a transparent conductive film.

That is, according to the present invention, it is possible to provide a thin-film-transistor-array substrate, comprising:

an insulating substrate;

a thin-film transistor formed on the insulating substrate in a matrix;

a conductive wiring formed on the insulating substrate and electrically connected to said thin-film transistor;

an insulating film formed adjacently to said conductive wiring;

a polymer insulating film containing an organic polymer formed on the insulating film and having an edge portion; and an etching stopper formed on the insulating layer and protruded from the edge of the polymer insulating film.

In the thin-film-transistor-array substrate of the present invention, the above polymer insulating film may contain a photosensitive resin or a photosensitive polymer composition selected out of acrylic resin, polyimide resin, and polybenzocyclobutene. Moreover, the insulating film may include a first insulating film and a second insulating film and the etching stopper is formed on the first insulating film.

In the thin-film-transistor-array substrate of the present invention, the insulating film may include a first insulating film and a second insulating film and the above etching stopper is formed on the above second insulating film. In the present invention, the conductive wiring may include a first conductive wiring and a second conductive wiring, the first conductive wiring includes a wiring pattern, and the etching stopper is formed of the same material layer as the second conductive wiring. Moreover, the present invention further includes a transparent conductive film for forming a pixel electrode.

Furthermore, in the present invention, it is preferable that at least one of the above first and second conductive wirings is set in the insulating structure formed of the insulating film in which the portion exposed from the edge portion is adjoined.

Furthermore, the present invention provides a fabrication method of a thin-film-transistor-array substrate of the present invention which comprising the steps of:

providing an insulating substrate, depositing a conductive material on the insulating substrate, and patterning the material to form a conductive wiring including an wiring pattern;

forming an thin-film-transistor structure including a first insulating film; depositing a second insulating film for covering at least the thin-film-transistor structure;

forming a polymer insulating film containing an organic polymer on the second insulating film and patterning the polymer insulating film to form an edge of said organic polymer insulating film; and etching at least the first insulating film by using an etching stopper to form an insulating structure which covers the conductive wiring protruded from said edge of said polymer insulating film.

In the case of a fabrication method of the present invention, the above polymer insulating film may contain a photosensitive resin or a photosensitive polymer composition selected out of acrylic resin, polyimide resin, and polybenzocyclobutene. Moreover, the above etching stopper may be formed on the first insulating film. Furthermore, the etching stopper may be formed on the above second insulating film.

A fabrication method of the present invention further comprises a step of forming another conductive wiring and the etching stopper is formed of the same material layer as the another conductive wiring. In the present invention, a transparent conductive film for forming pixel electrodes is formed on the polymer insulating film before patterning the polymer insulating film.

Moreover, the present invention provides a display device including the thin-film-transistor-array substrate mentioned above. In the case of the present invention, the display device can be selected from a liquid-crystal display device and an electroluminescence display device.

DETAILED DESCRIPTION OF THE INVENTION

Figure 1:
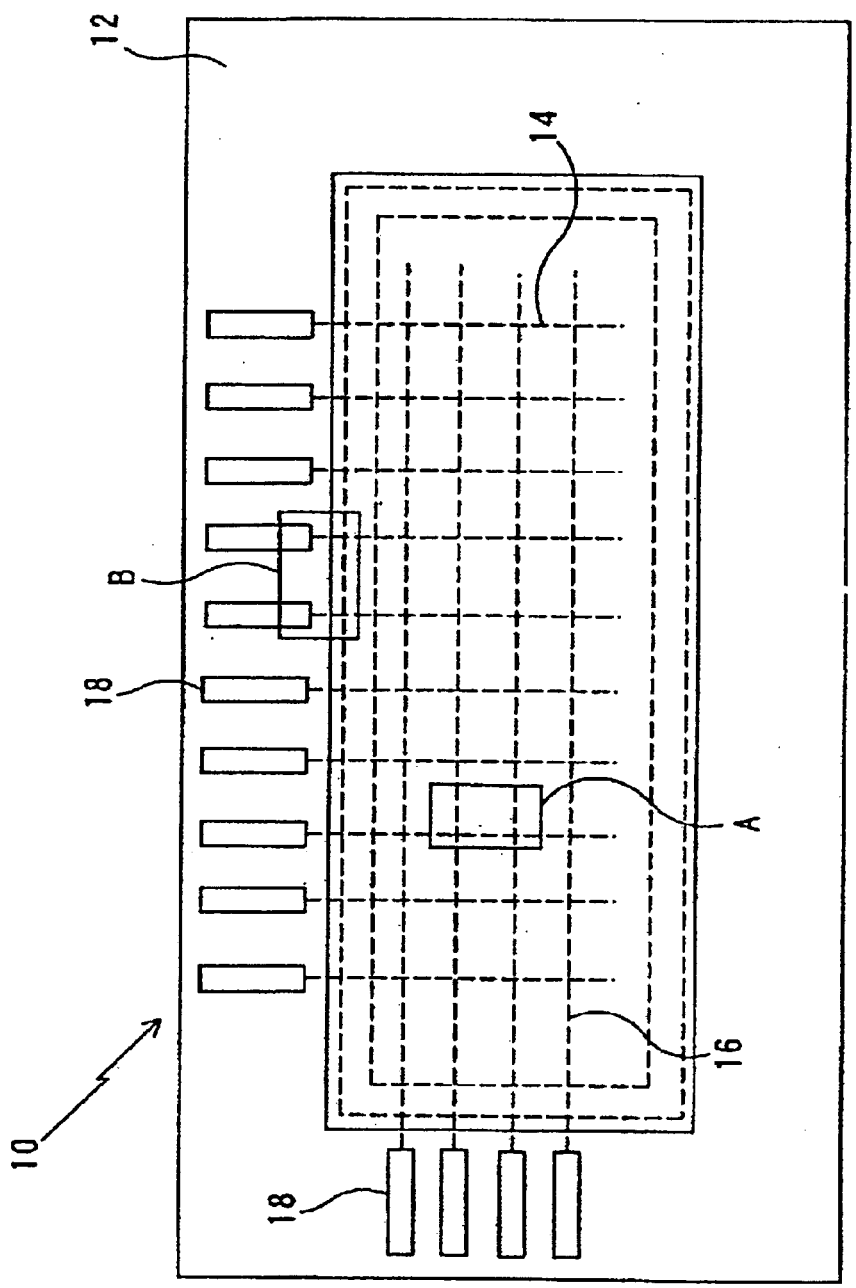
FIG. 1 is a top view of a TFT array substrate of the present invention.

The present invention will now be described in detail by referring to the drawings that accompany the preferred embodiment of the present invention. However, the present invention is not limited to the specific embodiment to be described below.

FIG. 1 shows a top view of a TFT array substrate 10 of the present invention. In the present invention, the TFT array substrate 10 has a plurality of films deposited and patterned on an insulating substrate 12 made of glass or the like, and also has a gate bus line 16 and a source bus line 14 are formed. In the case of the embodiment of the present invention shown in FIG. 1, thin-film-transistors are formed around the intersection between the gate bus line 16 and source bus line 14 and arranged like a matrix on the TFT array substrate 10.

A first conductive wiring of the present invention includes a wiring or generally an interconnect from pad to array wiring or a particular wiring pattern (so-called fan-out) for a wiring. Specifically, when directly connecting the source bus line 14 and gate bus line 16 to a terminal 18 without forming any additional wiring, conductive wirings such as the source bus line 14 and gate bus line 16 to be connected to the connection terminal 18 are included.

As well as, a second conductive wiring of the present invention denotes a source bus line 14, a gate bus line 16, a conductive wiring not directly connected to the terminal 18 formed of a gate material, or a conductive wiring not directly connected to the terminal 18 formed of a source-wiring (signal-wiring) material.

The gate bus line 16 and source bus line 14 are extended to an edge portion of the insulating substrate 12 surrounding an area in which thin-film-transistor array is formed, and connected to the corresponding terminals 18. The terminal 18 is exposed to the outside from the edge of an interlayer insulating film by etching the interlayer insulating film. The terminal 18 is formed correspondingly to the each of gate bus lines 16 and source bus lines 14 at the edge portion of the insulating substrate 12. Moreover, the terminal 18 is electrically connected to each thin-film-transistor through the wiring connected to the each lines extended from the interlayer insulating film.

Figure 2:
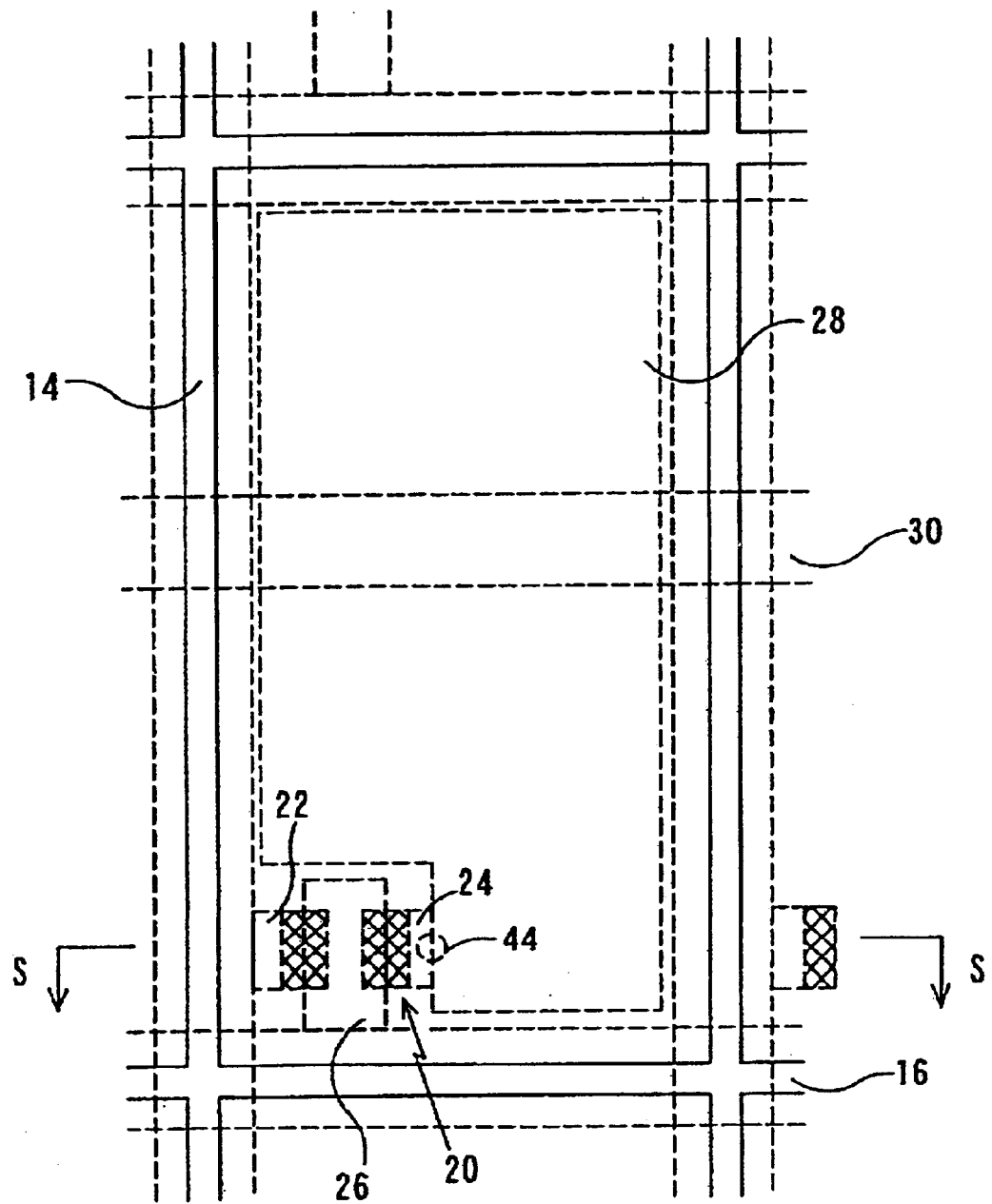
FIG. 2 is an enlarged view of an area shown by A of the TFT array substrate of the present invention shown in FIG. 1.

FIG. 2 is an enlarged view of an area in which the thin-film-transistor array shown by A in FIG. 1 is formed. As shown in FIG. 2, thin-film-transistors 20 constituting the TFT array substrate 10 of the present invention are formed around the intersections between the gate bus lines 16 and source bus lines 14. The thin-film-transistors shown in FIG. 2 are respectively constituted by including a source electrode 22, a drain electrode 24, and a gate electrode 26. As shown in FIG. 2, the source bus line 14 is connected to a source electrode 24 of the thin-film transistor used for the present invention and the gate bus line 16 is connected to the gate electrode 26.

Moreover, in the embodiment of the TFT array substrate shown in FIG. 2, the drain electrode 24 is connected to a pixel electrode 28 formed by indium-tin-oxide (ITO) through a contact hole 44. Furthermore, in the embodiment shown in FIG. 2, an auxiliary capacity line 30 is formed so as to adjust the capacity of the TFT array substrate 10. Furthermore, the pixel electrode 28 formed in the area surrounded by the gate bus line 16 and source bus line 14 is constituted so as to properly drive a display device by applying an electric field controlled by the thin-film-transistor to a liquid-crystal cell (not shown in the drawing).

Figure 3:
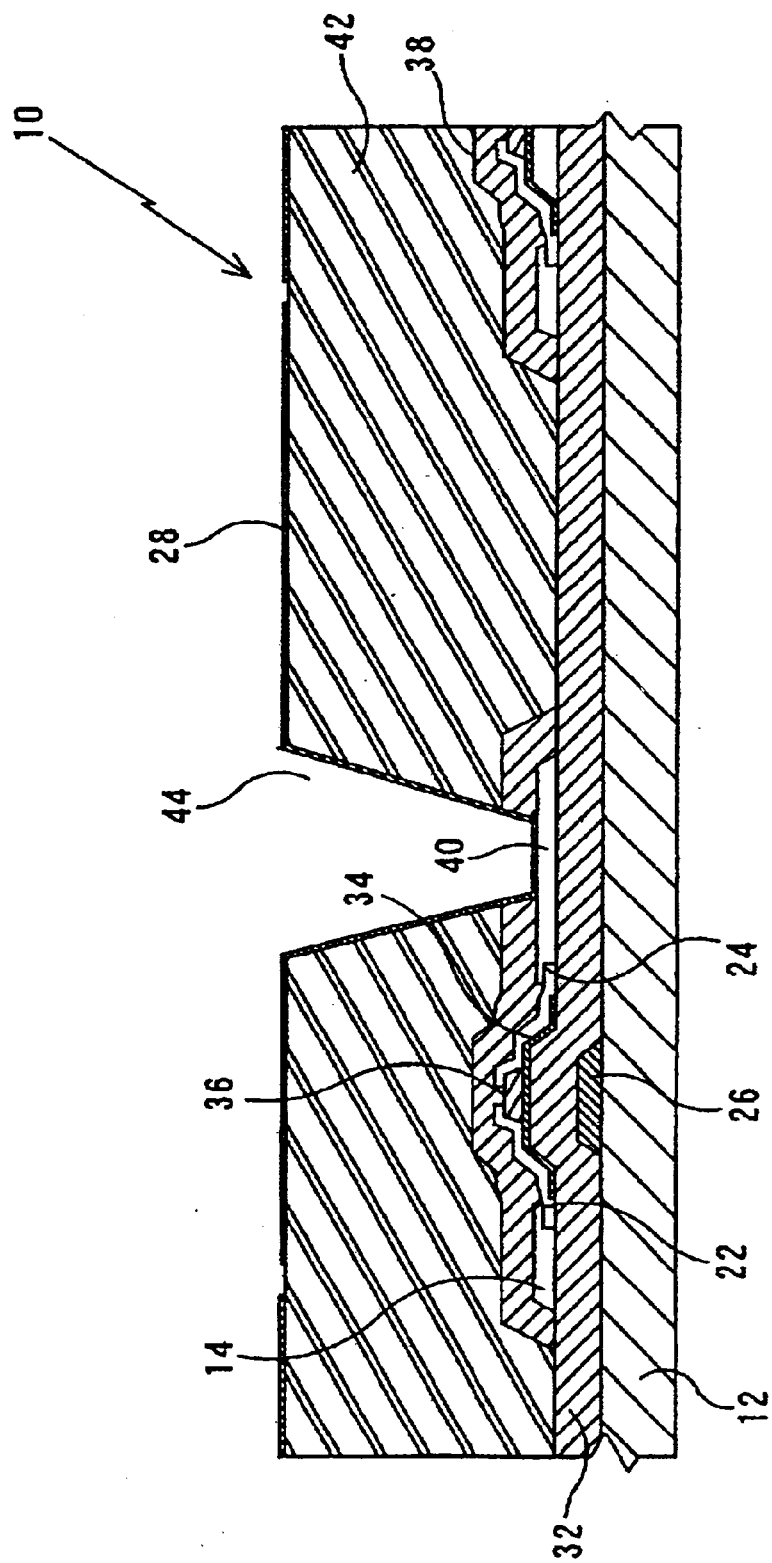
FIG. 3 is a sectional view of the TFT array substrate of the present invention taken on the line S—S of FIG. 2.

FIG. 3 is a sectional view showing a configuration of the TFT array substrate 10 of the present invention in detail taken on the line S—S of FIG. 2. The TFT array substrate 10 of the present invention is constituted by including the gate electrode 26 formed on the transparent insulating substrate 12 made of glass, and a gate insulating film 32 formed on the gate electrode 26, that is, the substrate 10 includes a thin-film-transistor having the so-called inverse-stagger-type configuration. A semiconductor layer 34 containing polysilicon and amorphous silicon is formed on the gate insulating film 32, a channel protective film 36 is formed on the semiconductor layer 34, and the source electrode 22 and drain electrode 24 are formed adjacently to the channel protective film 36. In the present invention, to constitute the thin-film transistor 20, it is possible to use not only the inverse-stagger type TFT shown in FIG. 3 but also a normal-stagger-type TFT, that is, a top-gate-type thin-film-transistor.

On the thin-film-transistor structure which can be used for the present invention shown in FIG. 3, a passivation film 38 is deposited over the thin-film-transistor structure to protect the thin-film-transistor structure. Moreover, on the TFT array substrate 10 of the present invention, the pixel electrode 28 is formed over an area necessary for display and an interlayer insulating film 42 is formed between the pixel electrode 28 and any conductive wirings or electrodes formed in underlying layer under the electrode 28 in order to reduce the parasitic capacity and to reduce unevenness occurred by the pattern formed in the underlying layer.

The pixel electrode 28 is connected to the drain electrode 24 through the contact hole 44 formed in the interlayer insulating film 42 and via a wiring 40. Moreover, the source bus line 14 is formed on the TFT array substrate 10 of the present invention shown in FIG. 3 and connected to the source electrode 22.

Figure 4:
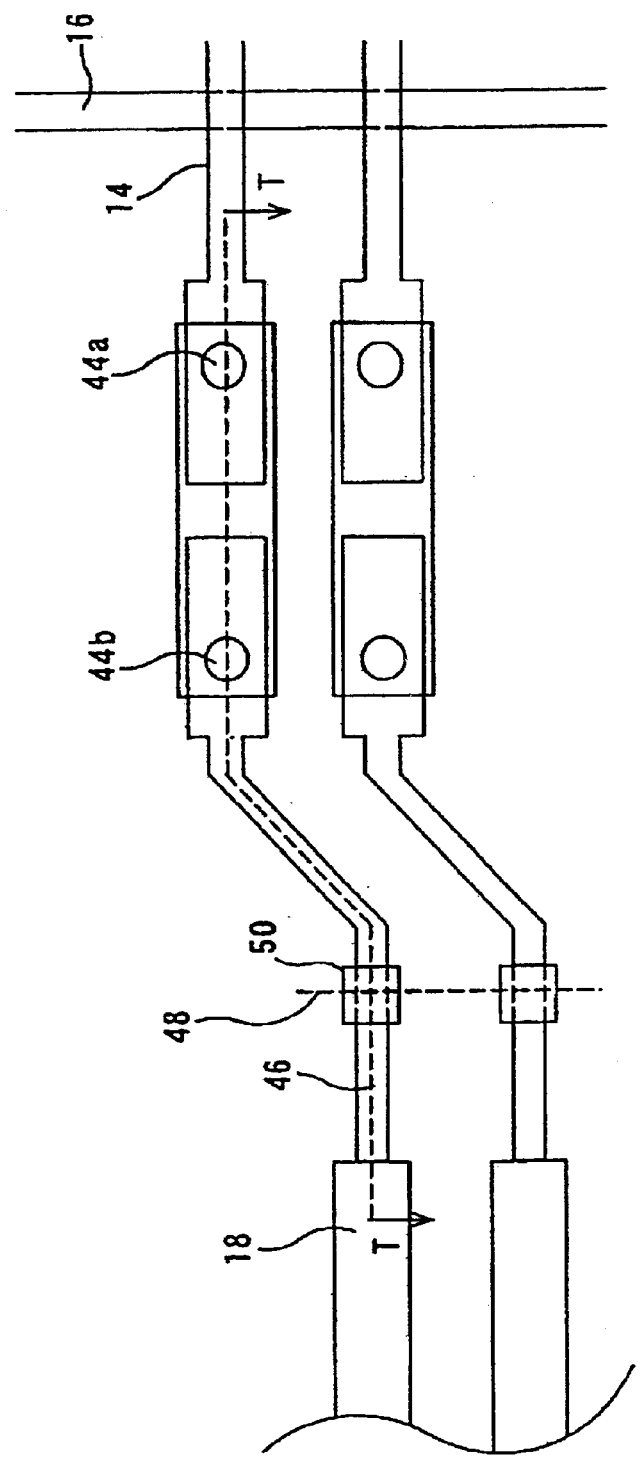
FIG. 4 is an enlarged view of the area shown by B of the TFT array substrate of the present invention in FIG. 1.

FIG. 4 is an enlarged view of the area shown by B in FIG. 1. As shown in FIG. 4, the gate bus line 16 and source bus line 14 are connected to the terminal 18 from the area in which a TFT array having the structure mentioned above is formed through a wiring or an interconnect exposed from the edge of the interlayer insulating film. In the embodiment of the present invention shown in FIG. 4, the source bus lines 14 extended from the area in which thin-film-transistors 20 formed like a matrix are formed are electrically connected to their corresponding terminals 18.

The interconnecting will be now described in more detail. The source bus line 14 extended from the area in which the thin-film-transistors 20 in the TFT array substrate 10 are formed is once connected upward to an ITO film 54 (shown in FIG. 5) formed on the interlayer insulating film through the contact hole 44a formed at the interconnecting portion. Then, the line 14 is connected by the ITO film 54, extended downward to the wiring 46 extended from the terminal 18 through another contact hole 44b.

In FIG. 4, an interlayer insulating film (not shown) is etched to form the edge 48 of the interlayer insulating film from which the wiring 46 is exposed to the outside shown by a dashed line. In the case of the embodiment shown in FIG. 4, an etching stopper 50 is formed under the interlayer insulating film 42 and on a gate insulating film 32 (not shown). The etching stopper 50 may be formed of a conductive material for forming the source bus line 14 of the present invention.

Figure 5:
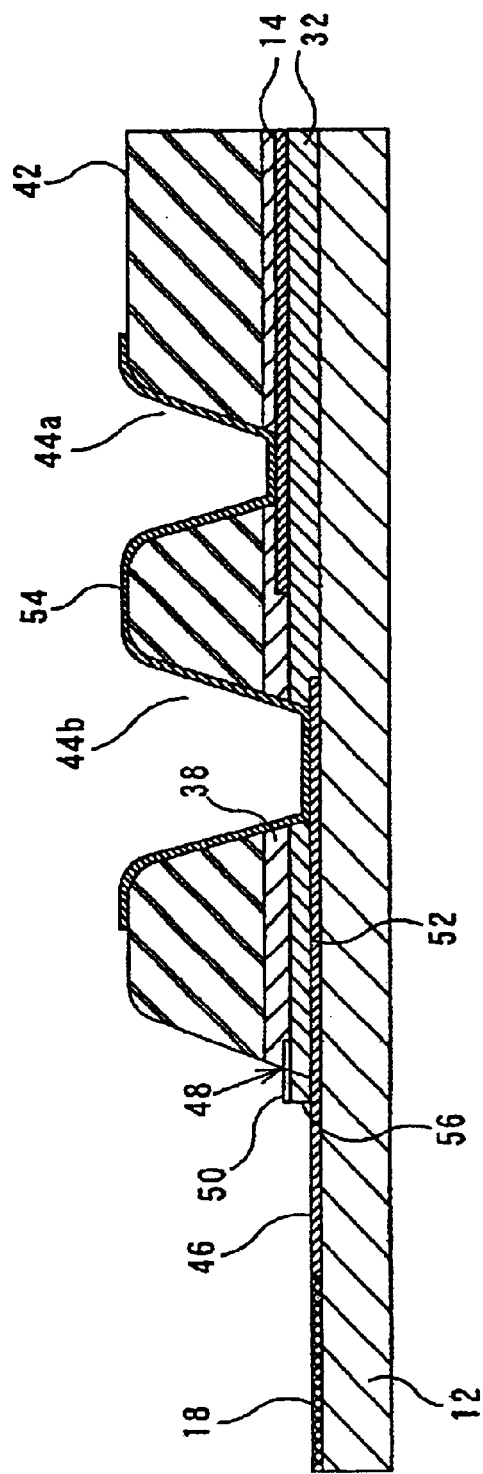
FIG. 5 is a sectional view taken on the line T—T in FIG. 4.

FIG. 5 is a sectional view of the interconnecting taken on line T—T of FIG. 4. As shown in FIG. 5, the interconnecting is formed on the insulating substrate 12 and constituted by including a wiring pattern 52 deposited of a material for forming a gate wiring for forming the connection terminal 18 and wiring 46 and the gate-insulating film 32 formed on the wiring pattern 52. Moreover, the source bus line 14 is formed on the gate-insulating film 32, and furthermore, the passivation film 38 is deposited so as to cover them. The interlayer insulating film 42 is formed on the passivation film 38 and the TFT array substrate 10 of the present invention is finally constituted. Pluralities of contact holes 44a and 44b are formed on the interlayer insulating film 42 to connect the source bus line 14 with the terminal 18 by the transparent conductive film 54 formed of a material such as ITO deposited along the interlayer insulating film 42 as shown in the embodiment of FIGS. 4 and 5.

As shown in FIG. 5, the etching stopper 50 is formed on the TFT array substrate 10 of the present invention adjacently to the edge 48 of the interlayer insulating film 42. The etching stopper 50 forms an insulating structure 56 to be mentioned below by preventing the gate-insulating film 32 under the etching stopper 50 from being removed due to an etchant made of buffered hydrofluoric acid used to pattern the passivation film 38 by a photolithography process.

The insulating structure 56 mentioned above includes the gate insulating film 32 left under the etching stopper 50 without being etched and protruded from the edge 48 of the interlayer insulating film 42 along the etching stopper 50 to cover the wiring 46. In the present invention, the width of the etching stopper 50 can be set to a value at which the insulating structure can be formed to securely cover the underlying conductive wiring. Specifically, when considering a tapered shape formed by the etching, it is preferable that the width of the stopper 50 is equal to or more than the width of the conductive wiring to be covered.

Figure 6:
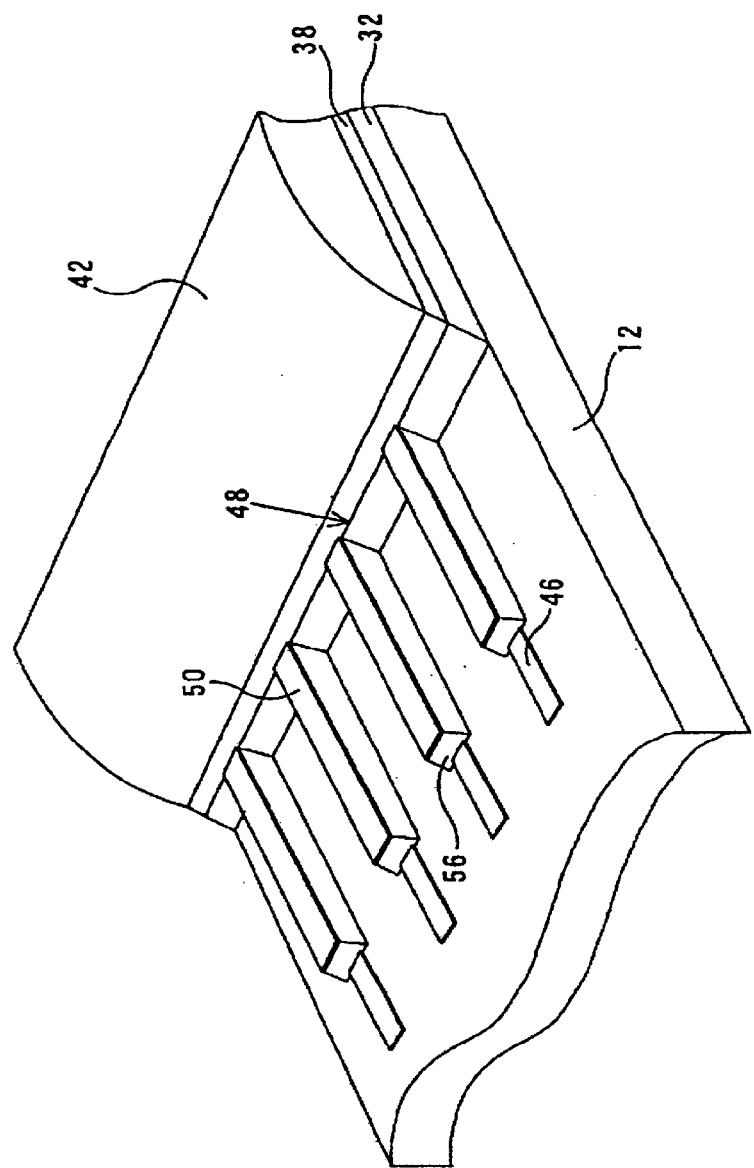
FIG. 6 is an enlarged view of the vicinity of a interlayer insulating film of a TFT array substrate of the present invention.

FIG. 6 shows an enlarged perspective view of the portion around the edge 48 of the interlayer insulating film 42 on which the insulating structure 56 described in FIG. 5 is formed. As shown in FIG. 6, the etching stopper 50 protrudes from the edge 48 of the interlayer insulating film 42 and the insulating structure 56 is formed under the etching stopper 50. In the embodiment shown in FIG. 6, the insulating structure 56 is constituted by the gate-insulating film 32 as described above to cover the wiring 46 formed by being included in the wiring pattern 52 formed under the insulating structure 56.

In the embodiment shown in FIG. 6, the etching stopper 50 is extended along with the wiring line 46. In the present invention, however, the etching stopper 50 can have any shape, length, and dimension as long as the stopper 50 can provide the insulating structure 56 capable of completely covering at least the wiring 46. Thus, it is possible to properly set them by considering the productivity, cost, and spatial requirement.

Figure 7:
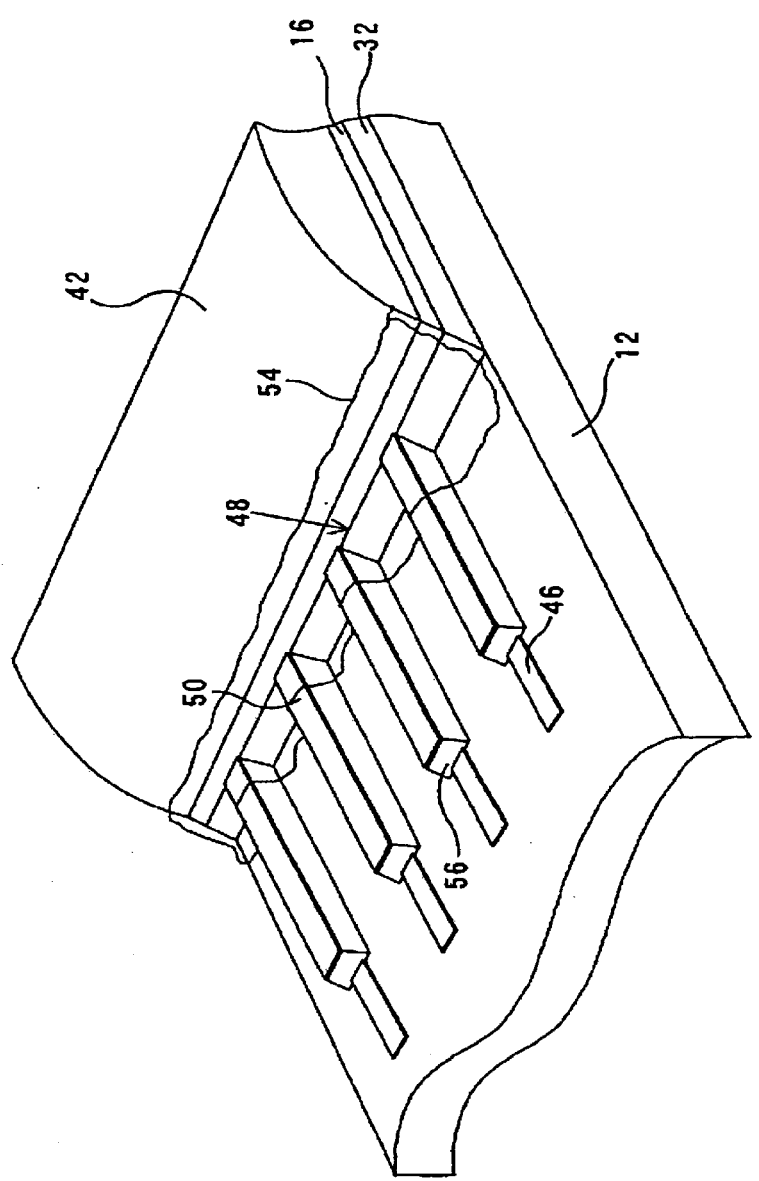
FIG. 7 is a schematic view showing a TFT array substrate of the present invention but a transparent conductive layer remains thereon.

FIG. 7 is a perspective view schematically showing a state in which the transparent conductive film 54 made of ITO deposited in a process of forming the pixel electrode of the TFT array substrate 10 of the present invention is left nearby the edge 48 of the interlayer insulating film 42 because of not being completely etched. As shown in FIG. 7, the transparent conductive film 54 remains nearby the wiring 46 so as to cover the edge 48 of the interlayer insulating film 42 after the stripping process of the photoresist because the film thickness of photoresist increases nearby the edge 48 and thus, the photoresist is not completely removed.

In the TFT array substrate 10 of the present invention, since the wirings 46 are covered with the insulating structure 56, a short circuit does not occur between the wirings 46 even if the transparent conductive film 54 remains. Therefore, the present invention makes it possible to effectively prevent the product yield from being lowered due to the short circuit between the wirings 46 and to provide flexibility for the following processes.

Figure 8:
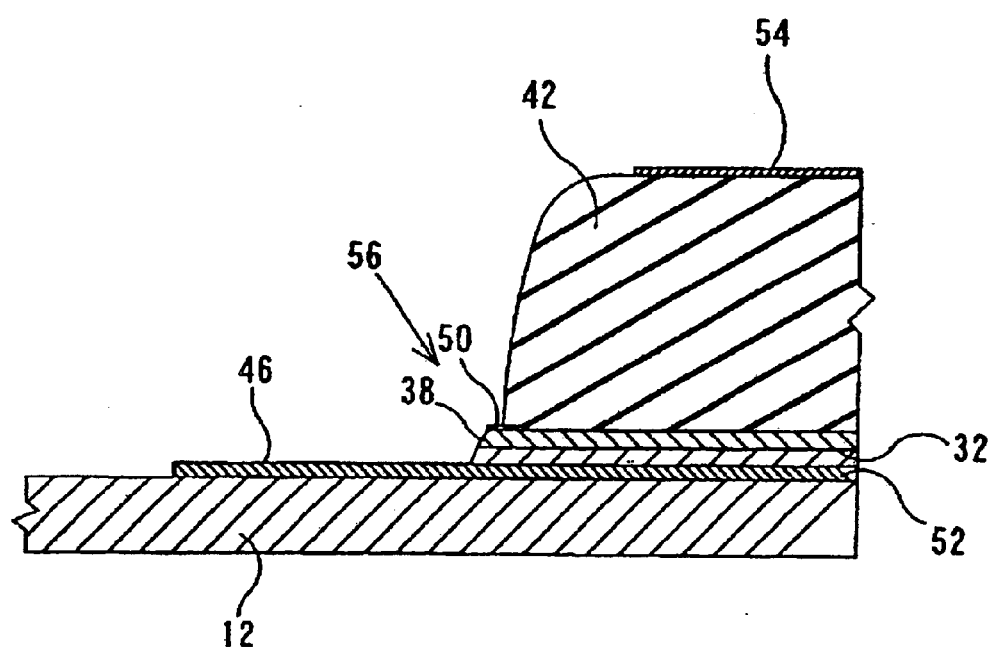
FIG. 8 is an illustration showing a second embodiment of a TFT array substrate of the present invention.

FIG. 8 shows a second embodiment of the TFT array substrate 10 of the present invention. In the embodiment shown in FIG. 8, the etching stopper 50 is formed on the passivation film 38. Also in the second embodiment shown in FIG. 8, the etching stopper 50 forms the insulating structure 56 by leaving the passivation film 38 and gate-insulating film 32 under the stopper 50 in the etching process.

In the first and second embodiments shown in FIGS. 5 to 7 and FIG. 8, the present invention is described by assuming that it is applied to a conductive wiring formed as the wiring pattern 52 to be connected to the source electrode 24 or the like including a signal wiring such as the source bus line 14. However, the present invention can be applied not only to a conductive wiring for forming the source electrode 24 or source bus line 14 or the like but also to a conductive wiring to be connected to the gate bus line 16 and gate electrode 26.

Moreover, the present invention can be applied not only to the area of the terminal 18 of the TFT array substrate 10 but also to an area such as a contact hole in which the edge of the interlayer insulating film 42 may be formed and the transparent conductive film 54 may remain.

Figure 9:
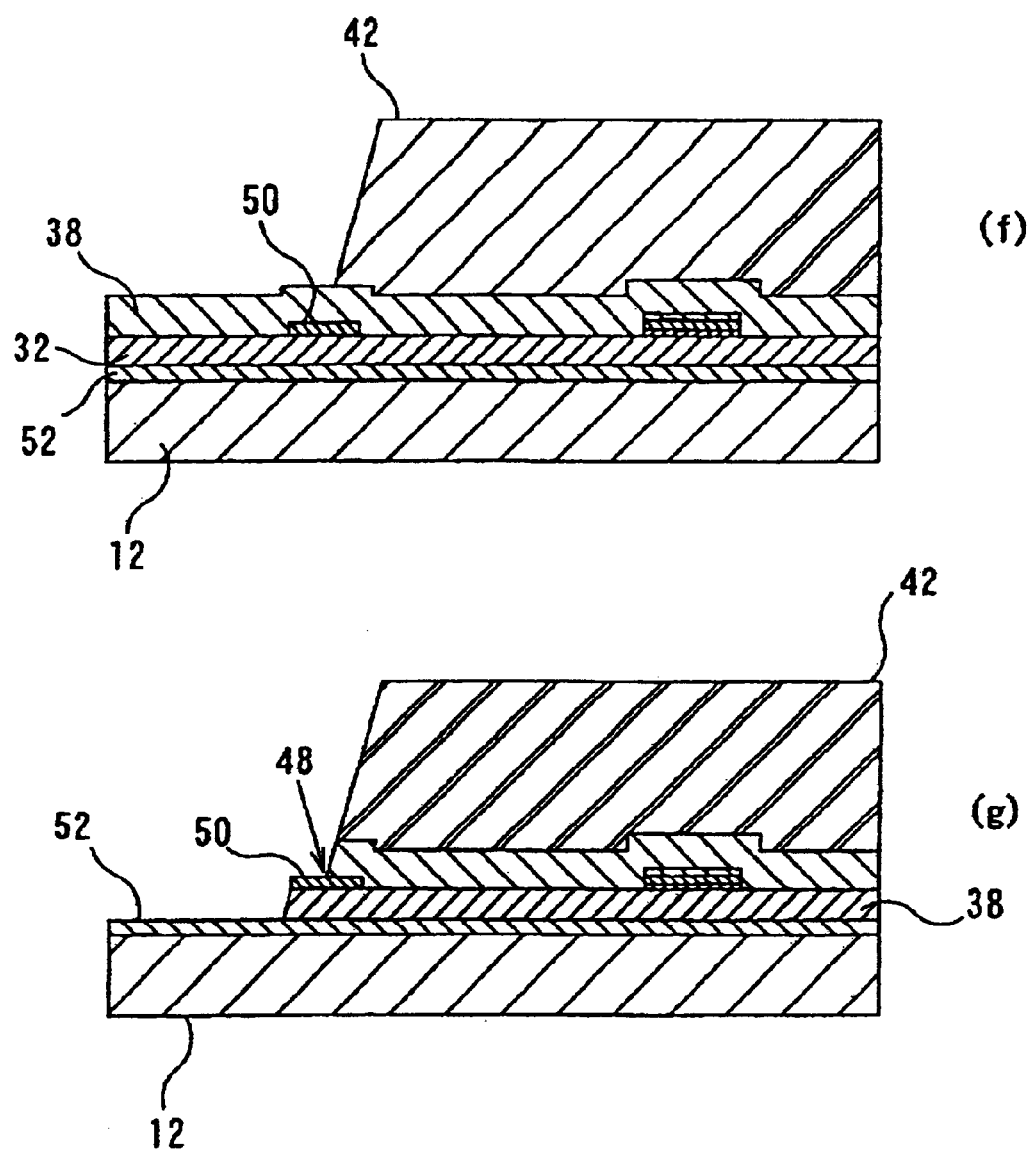
FIGS. 9(a) to 9(i) are illustrations showing fabrication processes of a TFT array substrate of the present invention.
Figure 9:
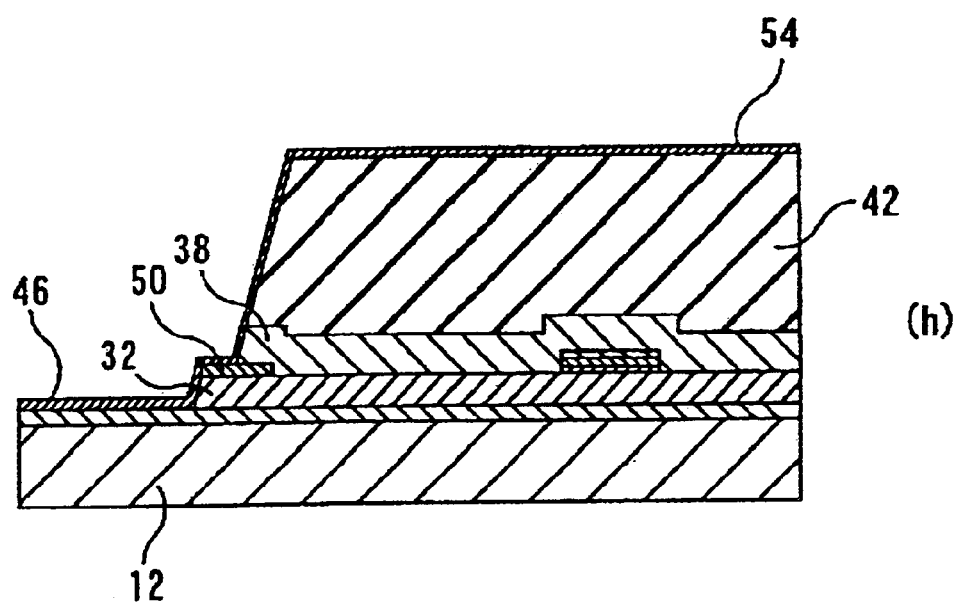
Figure 9:
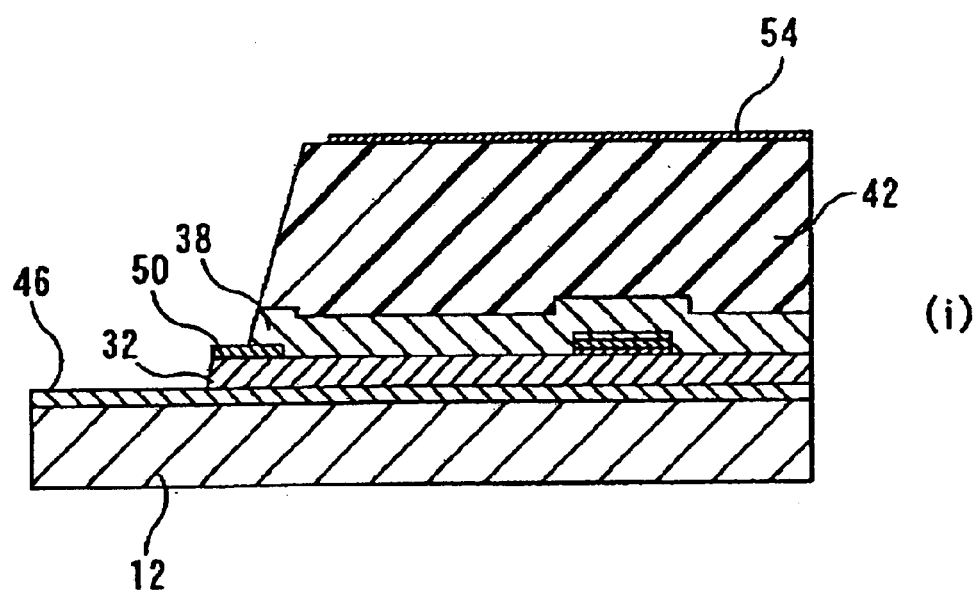

A fabrication method of the TFT array substrate 10 of the present invention is described below by referring to FIGS. 9(a) to (i). In the embodiments shown in FIGS. 9(a) to (i), the TFT array substrate 10 of the present invention is shown by cross sections along the wiring pattern 52. As shown in FIG. 9(a), in the fabrication process of the TFT array substrate 10 of the present invention, a proper conductive material such as tantalum, titanium, molybdenum, aluminum, and copper, or an alloy of these materials, a conductive material such as ITO or doped polysilicon, or a combined conductive material obtained by layering the above materials is deposited on the transparent insulating substrate 12 like a glass by using a proper method such as sputtering or vacuum evaporation.

Then, as shown in FIG. 9(b), a wiring pattern is formed by using a proper photolithography process. Then, as shown in FIG. 9(b), the gate-insulating film 32 is deposited by using a proper deposition process such as chemical vapor deposition (CVD). In the present invention, the gate-insulating film 32 may be made of materials selected from the group consisting of $SiO_2$, $SiO_x$, $SiN_y$, and $SiO_xN_y$ (x and y are positive real numbers). Then, the gate-insulating film 32 is patterned so as to expose the terminal 18 formed adjacently to the wiring pattern 52.

Then, as shown in FIG. 9(c), the semiconductor layer 34 is formed by depositing polysilicon or amorphous silicon and the channel protective film 36 is formed by depositing and patterning $SiN_y$ or the like. In FIGS. 9(a) to (i), an ohmic contact layer is not illustrated in order to simplify description.

Thereafter, as shown in FIG. 9(c), the etching stopper 50 used for the present invention is formed by depositing a conductive material such as molybdenum, aluminum, tantalum, titanium, copper, or ITO with using a proper patterning process. To deposit the etching stopper 50, it is possible to use a proper process such as sputtering or vapor evaporation. Moreover, as shown in FIG. 9(d), the etching stopper 50 is formed by pattering the deposited conductive material.

In this case, a material for forming the etching stopper 50 is not limited to ones exemplified above but also the conductive material as same as the source bus line 14 or the like. In the later case, it is also possible to form the source bus line 14 (not shown), wiring pattern 52 for the source bus line 14, source electrode 22, and the drain electrode 24 at the same time. Moreover, when forming the source bus line 14 and gate bus line 16 by the same material, it is possible to form the etching stopper 50 by the same material as that for forming gate wiring and source wiring. Furthermore, from the viewpoint of reducing the numbers of processes and steps, it is preferable to form the etching stopper 50 by patterning the same material layer as that for forming a gate wiring or source wiring. Furthermore, it is possible to form the etching stopper 50 by a material different from that of the gate wiring or the source wiring though the numbers of processes and steps are increased or to constitute the stopper 50 as an alloy multilayer structure containing a material for forming the gate wiring or the source wiring.

Thereafter, as shown in FIG. 9(d), the passivation film 38 is formed by depositing a material such as $SiO_2$, $SiO_x$, $SiN_y$, or $SiO_xN_y$ on the structure shown in FIG. 9(c) by a proper deposition process such as CVD.

Moreover, in the fabrication method of the TFT array substrate 10 of the present invention, the interlayer insulating film 42 is formed by applying a photosensitive resin or a photosensitive polymer composition containing an organic polymer such as acrylic resin, polyimide resin, or polybenzocyclobutene by spin coating as shown in FIG. 9(e).

FIGS. 9(f) and 9(g) shows further steps to be executed after the processes or steps shown in FIGS. 9(a) to 9(e). As shown in FIG. 9(f), the interlayer insulating film 42 is exposed by using a photomask and then the first etching is applied to the film 42 by using a proper etchant such as alkaline solution or a solvent. Then, as shown in FIG. 9(g), the second etching is applied to the film 42 by using a proper etchant such as a buffered hydrofluoric-acid solution to etch the passivation film 38 and gate-insulating film 32 so as to reach up to the wiring pattern 52.

After the etching in FIG. 9(g), a portion of wiring pattern 52 exposed from the edge of the interlayer insulating film 42 is covered with the insulating structure 54. Therefore, it may prevent occurring a short circuit between the wirings 46 if the transparent conductive film made of ITO to be deposited later remains.

Then, as shown in FIG. 9(h), in the fabrication method of the TFT array substrate 10 of the present invention, the transparent conductive film 54 made of ITO, IZO, or tin dioxide is deposited by a proper process such as sputtering or vapor evaporation. Then, the transparent conductive film 54 is etched by a photolithography process to expose the wiring 46 and the terminal 18 (not shown), as shown in FIG. 9(i).

Figure 10:
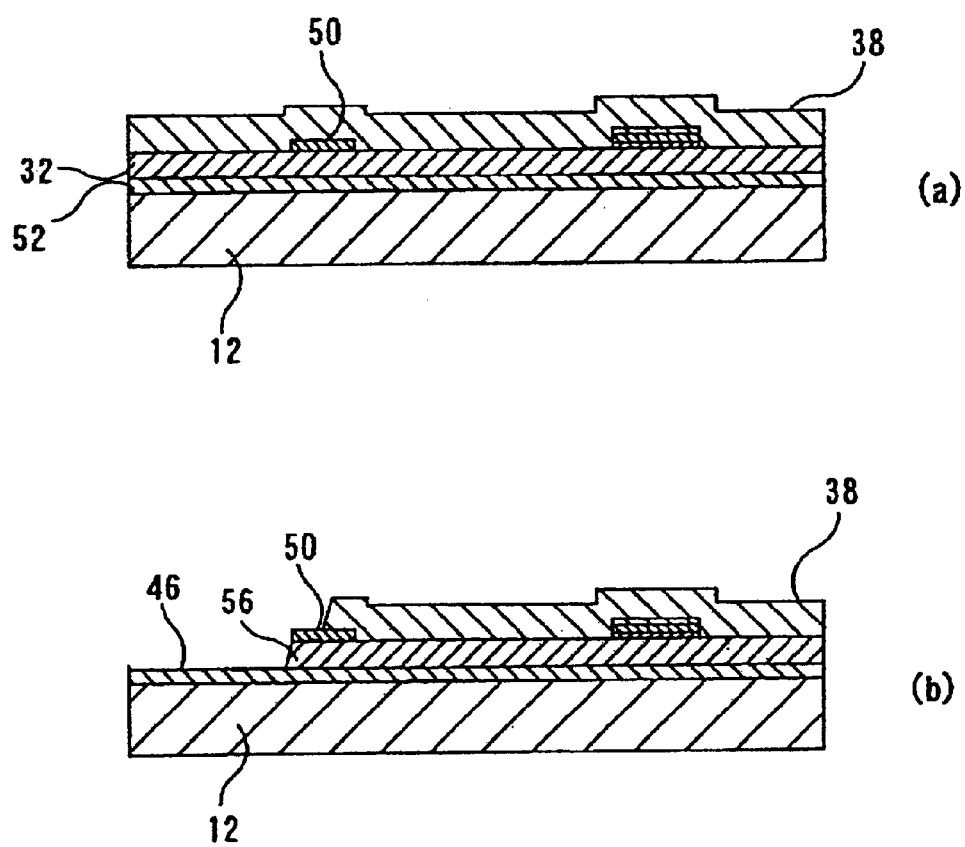
FIGS. 10(a) and 10(b) are illustrations showing fabrication processes of a second embodiment of a TFT array substrate of the present invention.

FIGS. 10(a) and 10(b) show a second embodiment of a TFT array substrate fabrication method of the present invention. In the second embodiment of the TFT array substrate fabrication method of the present invention shown in FIG. 10, the passivation film 38 is previously etched for the structure in FIG. 10(a) formed by the process in FIG. 9(d) to form the insulating structure 56 shown in FIG. 10(b). In this case, the passivation film 38 such as the portion corresponding to the terminal 18 is exposed by a photolithography process. Then, the TFT array substrate 10 of the present invention is fabricated through processes same as those shown in FIGS. 10 and 11.

Figure 11:
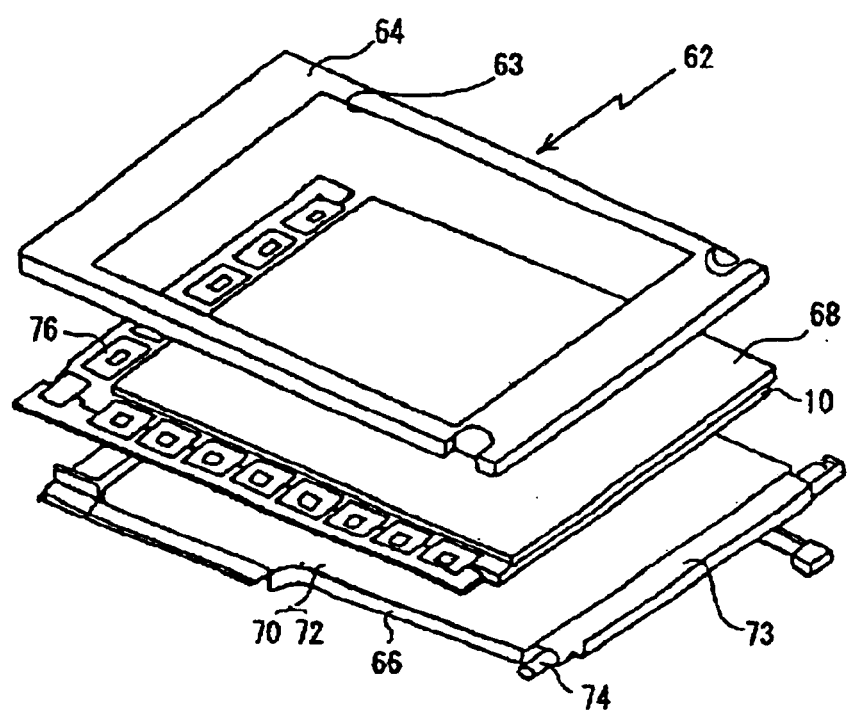
FIG. 11 is an illustration showing an embodiment of a display device of the present invention.
Figure 12:
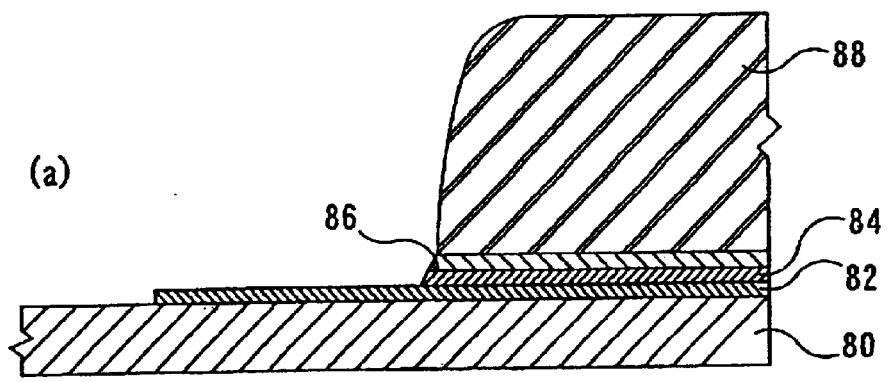
FIGS. 12(a) to 12(c) are illustrations showing a conventional fabrication method of a TFT array substrate including a PFA structure.
Figure 12:
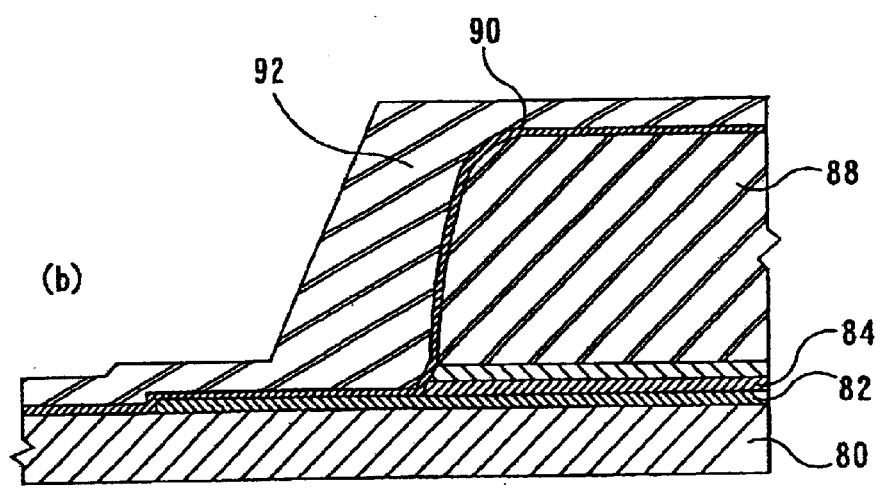
Figure 12:
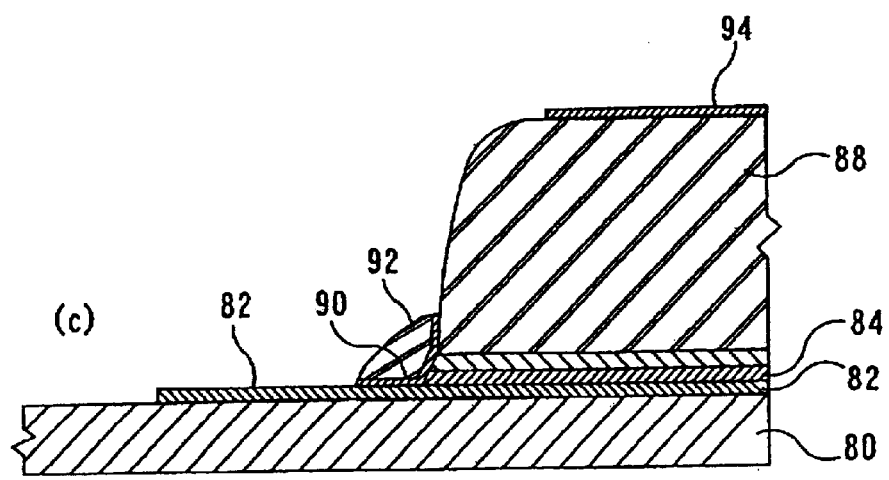
Figure 13:
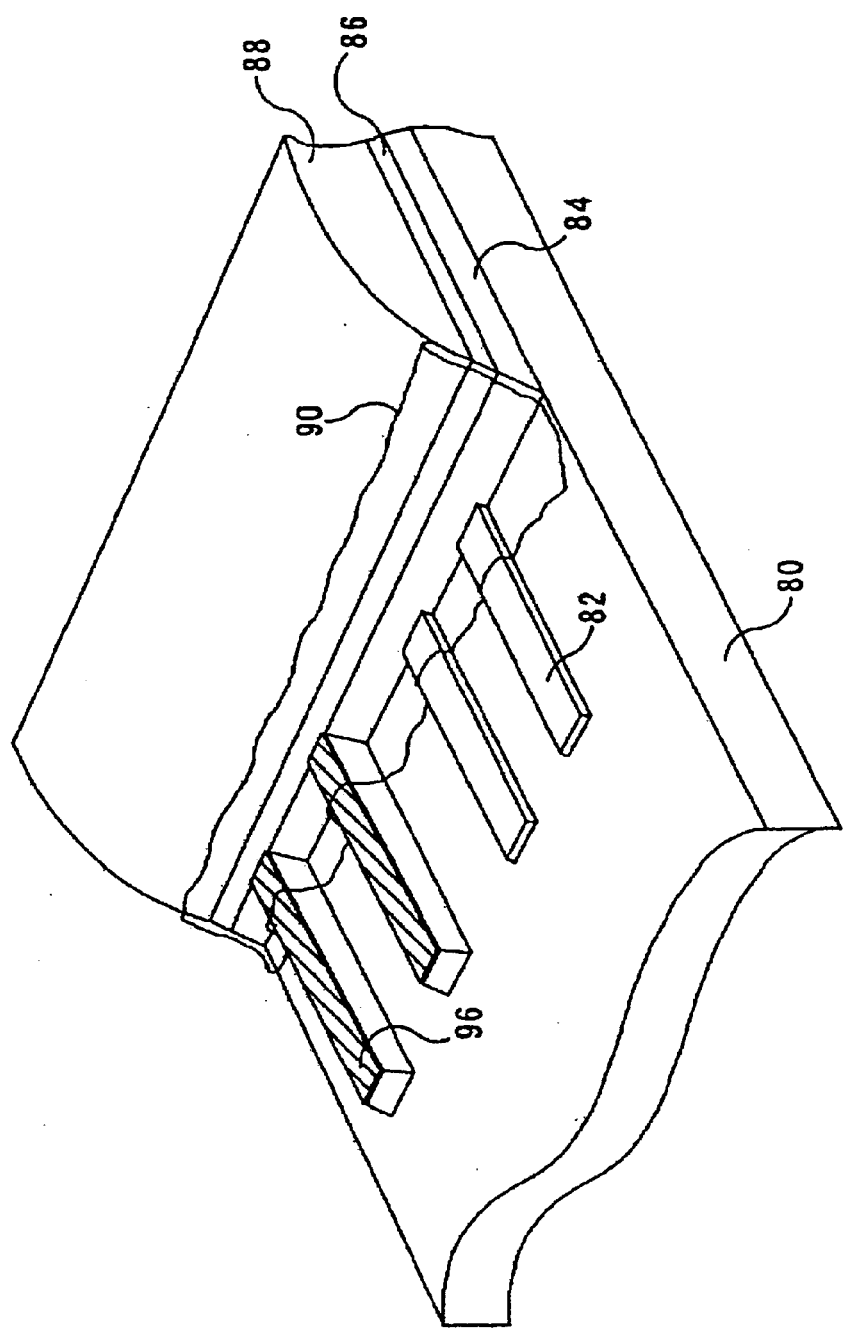
FIG. 13 is an illustration showing a conventional TFT array substrate in which a transparent conductive film remains nearby the edge of a conventional interlayer insulating film.

FIG. 11 is a schematic view showing an embodiment of a display device using the TFT array substrate 10 of the present invention. In the embodiment shown in FIG. 11, a liquid-crystal display 62 is shown as a display device.

As shown in FIG. 11, the liquid-crystal display 62 as an embodiment of the present invention is constituted by comprising a frame 64 on which an opening for constituting a display window 63 is formed, a light-guide plate 66 constituting a backlight unit, the TFT array substrate 10 of the present invention held between the frame 64 and the light-guide plate 66, and a liquid-crystal cell 68 set adjacently to the TFT array substrate 10. And, the liquid-crystal display 62 shown in FIG. 11 further comprises a prism sheet 70 and a diffusion sheet 72 arranged adjacently to the light-guide plate 66.

A cold cathode tube 74 is held in a reflector 73 at the side of the light-guide plate 66. And then the light-guide plate 66, prism sheet 70, diffusion sheet 72, reflector 73, and cold cathode tube 74 constitute a backlight unit for applying rays to the liquid-crystal cell 68. In the present invention, the liquid-crystal display 62 may comprise further any member having been known so far including a member such as a reflection sheet (not shown).

A not-illustrated pixel electrode is formed in an inside area of the display window 63 in which matrix-like thin-film transistors of the TFT array substrate 10 of the present invention are formed to generate an electric field necessary for display to applying to the liquid-crystal cell 68 set adjacently. TAB (Tape Automated Bonding) ICs (Integrated Circuits) 76 having a TCP (Tape Carrier Package) type driver are arranged at the surrounding area of the TFT array substrate 10 shown in FIG. 11. These TAB ICs 76 are connected to the terminal (not shown) and moreover supply a driving signal to the thin-film-transistor through the source bus line and the gate bus line.

The liquid-crystal display 62 of the present invention can use not only the above TAB IC 76 but also any mounting system having been known so far such as a COG (Chip On Glass) system in which a bare chip of a driver LSI is directly connected to a thin-film-transistor array substrate 12.

Though the present invention has been described in detail by referring to the embodiments shown in drawings, it is not restricted to these embodiments. The present invention can be applied to shapes, dimensions, and change of orders of details of a fabrication process as long as advantages of the present invention can be obtained.

Moreover, a TFT array substrate of the present invention can be used not only for the embodiments shown in drawings but also for a TFT array substrate for driving a reflection-type liquid-crystal display and an electroluminescence display device using an organic material or inorganic material as an active matter. In this case, it is unnecessary that the insulating substrate 12 is transparent and it is possible to form the insulating substrate 12 by any insulating material.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

We claim:

1. A thin-film-transistor array substrate, comprising:
   an insulating substrate;
   a thin-film-transistor formed on said insulating substrate in a matrix;
   a conductive wiring formed on said insulating substrate and electrically connected to said thin-film-transistor;
   an insulating film formed adjacently to said conductive wiring;
   a polymer insulating film formed on said insulating film and having an edge; and
   an etching stopper formed on said insulating film so as to form an insulating structure on said conductive wiring comprising said etching stopper and insulating film, said insulating structure protruding from the edge of said polymer-insulating film.

2. The thin-film-transistor array substrate according to claim 1, wherein
   said polymer insulating film contains a photosensitive resin or a photosensitive polymer composition selected from acrylic resin, polyimide resin, and polybenzocyclobutene.

3. The thin-film-transistor array substrate according to claim 1, wherein
   said insulating film includes a first insulating film and a second insulating film on said first insulating film and said etching stopper is formed on said first insulating film.

4. The thin-film-transistor array substrate according to claim 1, wherein
   said insulating film includes a first insulating film on said first insulating film and a second insulating film and said etching stopper is formed on said second insulating film.

5. The thin-film-transistor-array substrate according to claim 1, further comprising a transparent conductive film for forming a pixel electrode.

6. The thin-film-transistor array substrate according to claim 1, wherein
   said conductive wiring includes a first conductive wiring and a second conductive wiring, and said first conductive wiring includes a wiring pattern, and said etching stopper is made of the same material as said second conductive wiring.

7. The thin-film-transistor-array substrate according to claim 6, wherein at least one of said first and second conductive wirings is disposed in an insulating structure formed of said insulating film, a portion of the at least one of said first and second conductive wirings being exposed from said edge and being adjoined with said insulating film.

8. A display device comprising the thin-film-transistor array substrate of claim 1.

9. The display device according to claim 8, wherein
   said display device is selected from a liquid-crystal display or an electroluminescence display device.

10. A thin-film-transistor-array substrate fabrication method, comprising the steps of:
    providing an insulating substrate,
    depositing a conductive material on said insulating substrate and patterning said conductive material to form a conductive wiring including a wiring pattern;
    forming a thin-film-transistor structure including a first insulating film;
    forming a second insulating film for covering at least said thin-film-transistor structure;
    forming an etching stopper on said first or second insulating films;
    forming a polymer insulating film containing an organic polymer on said second insulating film and patterning said polymer insulating film to form an edge on said organic polymer insulating film; and
    etching said first and second insulating films and stopping on said etching stopper to form an insulating structure comprising said etching stopper and at least said first insulating film for covering said conductive wiring protruding from said edge to the outside of said polymer insulating film.

11. The thin-film-transistor-array substrate fabrication method according to claim 10, wherein
    said polymer-insulating film contains a photosensitive resin or a photosensitive polymer composition selected from acrylic resin, polyimide resin, and polybenzocyclobutene.

12. The thin-film-transistor-array substrate fabrication method according to claim 10, wherein
    said etching stopper is formed on said first insulating film.

13. The thin-film-transistor-array substrate fabrication method according to claim 10, wherein
    said etching stopper is formed on said second insulating film.

14. The thin-film-transistor-array substrate fabrication method according to claim 10, further comprising a step of forming another conductive wiring, wherein said etching stopper is formed of the same material layer as said another conductive wiring.

15. A thin-film-transistor-array substrate fabrication method, comprising the steps of:

providing an insulating substrate, depositing a conductive material on said insulating substrate and patterning said conductive material to form a conductive wiring including a wiring pattern;

forming a thin-film-transistor structure including a first insulating film;

forming a second insulating film for covering at least said thin-film-transistor structure;

forming an etching stopper on said first or second insulating films;

forming a polymer insulating film containing an organic polymer on said second insulating film and forming a transparent conductive film for forming a pixel electrode on said polymer insulating film and patterning said polymer insulating film and said transparent conductive film to form an edge on said organic polymer insulating film; and etching said first and second insulating films and stopping on said etching stopper to form an insulating structure comprising at least said first insulating film for covering said conductive wiring protruding from said edge to the outside of said polymer insulating film.

* * * * *